United States Patent [19]
Woods

[11] Patent Number: 5,731,579
[45] Date of Patent: Mar. 24, 1998

[54] ELECTRO-OPTICAL VOLTAGE SENSOR HEAD

[75] Inventor: Gregory K. Woods, Idaho Falls, Id.

[73] Assignee: Lockheed Idaho Technologies Company, Idaho Falls, Id.

[21] Appl. No.: 570,152

[22] Filed: Dec. 11, 1995

[51] Int. Cl.$^6$ .............. G02F 1/01; G01R 15/24
[52] U.S. Cl. .............. 250/227.17; 385/12; 324/96
[58] Field of Search .............. 250/225, 227.14, 250/227.17, 227.19, 227.21; 356/345, 351; 385/12; 324/96, 105, 244.1

[56] References Cited

U.S. PATENT DOCUMENTS

| | | | |
|---|---|---|---|
| 4,812,025 | 3/1989 | Miller | 350/435 |
| 5,083,221 | 1/1992 | Toyoda et al. | 359/245 |
| 5,095,514 | 3/1992 | Curtis | 385/12 |
| 5,113,131 | 5/1992 | Cooper et al. | 324/96 |
| 5,128,608 | 7/1992 | Ochi | 324/96 |
| 5,184,010 | 2/1993 | Lequime | 250/227.21 |
| 5,280,173 | 1/1994 | Morse et al. | 250/227.23 |
| 5,396,166 | 3/1995 | Vohra et al. | 324/96 |
| 5,416,860 | 5/1995 | Lee et al. | 250/227.17 |
| 5,450,006 | 9/1995 | Tatam | 250/227.17 |

FOREIGN PATENT DOCUMENTS

| | | | |
|---|---|---|---|
| 60-256068 | 12/1985 | Japan | 4/46.1 |
| 9110880 | 7/1991 | WIPO | 250/227.17 |

*Primary Examiner*—Edward P. Westin
*Assistant Examiner*—John R. Lee
*Attorney, Agent, or Firm*—Thorpe North & Western

[57] ABSTRACT

A miniature electro-optic voltage sensor system capable of accurate operation at high voltages. The system employs a transmitter, a sensor disposed adjacent to but out of direct electrical contact with a conductor on which the voltage is to be measured, a detector, and a signal processor. The transmitter produces a beam of electromagnetic radiation which is routed into the sensor where the beam undergoes the Pockels electro-optic effect. The electro-optic effect causes phase shifting in the beam, which is in turn converted to a pair of independent beams, from which the voltage of a system based on its E-field is determined when the two beams are normalized by the signal processor. The sensor converts the beam by splitting the beam in accordance with the axes of the beam's polarization state (an ellipse whose ellipticity varies between $-1$ and $+1$ in proportion to voltage) into at least two AM signals. These AM signals are fed into a signal processor and processed to determine the voltage between a ground conductor and the conductor on which voltage is being measured.

22 Claims, 6 Drawing Sheets

ELECTRO-OPTICAL VOLTAGE SENSOR HEAD

CONTRACTUAL ORIGIN OF THE INVENTION

The United States has rights in this invention pursuant to contract number DE-AC07-94ID13223 between the U.S. Department of Energy and Lockheed Idaho Technologies Company.

BACKGROUND OF THE INVENTION

1. Field of the Invention

The present invention pertains generally to the field of voltage sensors and more particularly to a voltage sensor head which utilizes the Pockels electro-optic effect to measure voltage.

2. Background Art

High-accuracy measurement of high voltage has traditionally been accomplished using iron-core ferro-magnetic potential transformers. The performance of these devices is inhibited by substantially limited dynamic range, bandwidth, and linearity. Poor electrical isolation presents yet another disadvantage. During electrical fault conditions these transformers can conduct dangerous levels of fault energy to downstream instrumentation and personnel, posing a substantial liability.

A variety of optic sensors for measuring voltage have been developed in attempts to offer the power industry a superior alternative to the require that direct electrical contact be made with the energized conductor. This contact is made necessary by the use of a voltage divider which is utilized to connect the sensing element with the energized conductor on which a measurement is to be made. Direct electrical contact with the conductor may alter or interrupt the operation of the power system by presenting a burden or load.

In addition to the disadvantages associated with direct electrical contact with the energized conductor, prior art voltage sensor systems are typically bulky, particularly in extremely high voltage applications. This is true because the size of the voltage divider required is proportional to the voltage being measured. The size of such systems can make them difficult and expensive to install and house in substations.

Many prior art sensors are based upon the electrostrictive principle which utilize interferometric modulation principles. Unfortunately, interferometric modulation is extremely temperature sensitive. This temperature sensitivity requires controlled conditions in order to obtain accurate voltage measurements. The requirement of controlled conditions limits the usefulness of such systems and makes them unsuited for outdoor or uncontrolled applications. In addition, interferometric modulation requires a highly coherent light source which is relatively expensive.

Systems which utilize mechanical modulation of the optical reflection within an optic fiber have also been developed. Among other drawbacks, the reliance of such systems on moving parts is a significant deterrent to widespread use.

Open-air E-field based sensors have also been developed, but lack accuracy when used for measuring voltage because the open-air E-field used varies with many noisy parameters including ambient dielectric constant, adjacent conductor voltages, moving conductive structures such as passing automobiles, and other electromagnetic noise contributions.

It would therefore be an advantage in the art to provide a sensor head which does not require direct electrical contact with the energized conductor, is compact, operates in a variety of temperatures and conditions, is reliable, accurate, and cost effective.

SUMMARY OF THE INVENTION

It is a primary object of the present invention to provide an electro-optic voltage sensor head which does not require electrical contact with an energized conductor.

It is a further object of the present invention to provide such an electro-optic voltage sensor head which is capable of use in a variety of environmental conditions.

It is also an object of the present invention to provide such an electro-optic voltage sensor head which can be employed to accurately measure high voltages without use of dedicated voltage division hardware.

It is a further object of the present invention to provide such an electro-optic sensor head which can be permanently installed.

It is an additional object of the present invention to provide such an electro-optic voltage sensor head which is completely passive and which minimizes the electronics needed for implementation.

It is a further object of the present invention to provide such an electro-optic voltage sensor head which can be integrated with existing types of high voltage power transmission and distribution equipment so as to reduce or eliminate the need for large stand-alone voltage measurement apparatus.

These and other objects of the present invention will become more fully apparent from the following description and appended claims or may be learned by the practice of the invention as set forth herein.

While the present invention is described in terms of a sensor head, it is to be understood that the subject apparatus and method may be used in any field of electrical or optical application. Those having ordinary skill in the field of this invention will appreciate the advantages of the invention, and its application to a wide variety of electrical devices.

The above objects and others not specifically recited are realized in a specific illustrative embodiment of an Electro-optic Voltage Sensor Head.

The sensor head includes a transducer comprised of a transducing material wherein the linear Pockels electro-optic effect is observed. In the practice of the invention at least one beam of polarized electromagnetic radiation is routed into the transducing material. Although the electromagnetic radiation used in the present invention may comprise any wavelength (in or out of the visible spectrum), the term "light" will be used hereinafter to signify electromagnetic radiation for the purpose of brevity. In the polarized beam the light has at least two components which propagate along at least two orthogonal planes, respectively, to form at least two orthogonal planes of the beam. The beam undergoes an electro-optic effect in the sensor head when the transducing material is subjected to an E-field. The electro-optic effect is observed as a phase shift between the orthogonal beam components. Because the two orthogonal components are shifted in opposing directions, this shift is referred to herein as a "differential phase shift," or "differential phase modulation." In the preferred embodiment the beam is routed through the transducer along an initial axis and then reflected by a retro-reflector backwardly along a second axis that is substantially parallel to the initial axis. In the preferred embodiment of the present invention the beam passes through the transducer and then is reflected back into the transducer, thus passing through the transducer twice.

The preferred embodiment of the sensor head also includes at least one beam splitter for splitting the beam's polarization state into two signals which are independent amplitude-modulated signals.

BRIEF DESCRIPTION OF THE DRAWINGS

The above and other objects, features and advantages of the invention will become apparent from a consideration of the subsequent detailed description presented in connection with the accompanying drawings in which.

DETAILED DESCRIPTION

Figure 1:
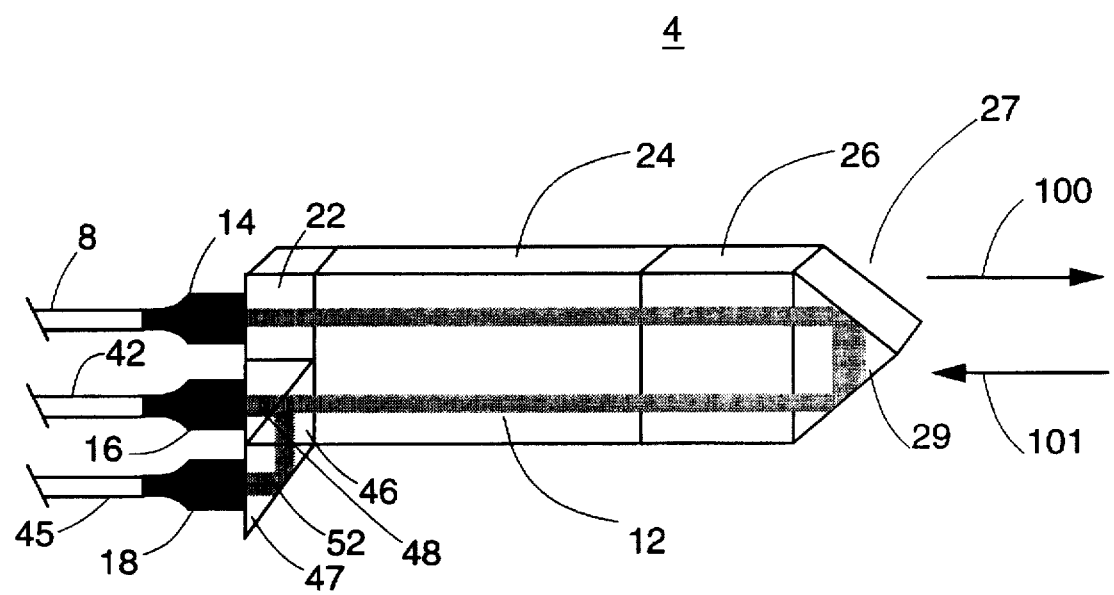
FIG. 1 is a schematic semi-three dimensional view of the sensor head made in accordance with the principles of the present invention.

A preferred embodiment in accordance with the present invention is illustrated in FIG. 1, which is a schematic semi-three dimensional view of the electro-optic voltage sensor head depicted generally at 4, which senses an electric field. The sensor head 4 of the present invention may be used for sensing the presence and magnitude of an electric field and for measuring voltage. A voltage measurement is a measure of the voltage difference (or electrical potential difference) between objects or positions. Voltage is proportional to the electric field (hereinafter "electric field" shall be indicated "E-field") depending upon the geometries, compositions and distances of the conductive and insulating matter. Where, as in the present invention, the effects of an E-field can be observed or sensed, a voltage measurement can be achieved.

Figure 2:
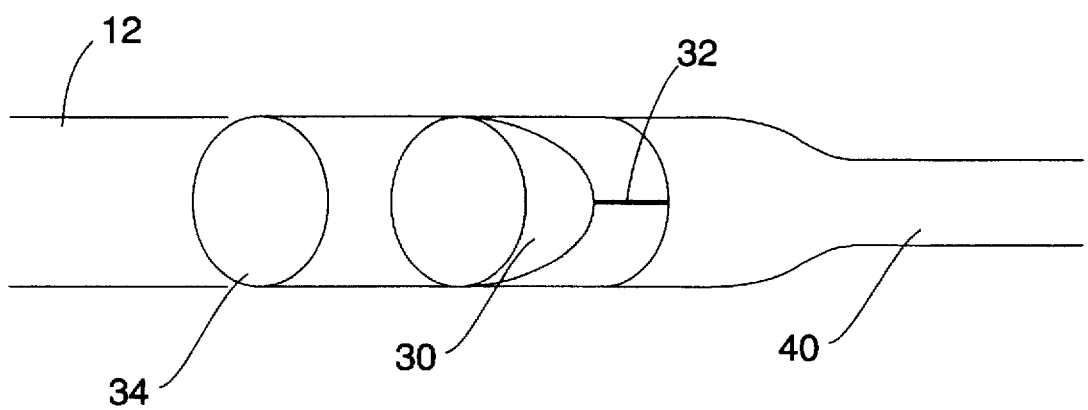
FIG. 2 shows a partially sectioned side view of the collimator of FIG. 1.

Prior to discussing the sensor head 4 further, consider the collimators 14, 16, 18, shown in FIGS. 1, 4, 5, and 6, which are generally represented by the collimator 20, shown in FIG. 2. A collimator 20 comprises a lens 30 and a transparent end 34 which can pass an electromagnetic radiation beam 12 into or out of the core 32 of an optic fiber 40.

As shown in FIG. 1, in the preferred embodiment a beam 12 is routed into the sensor head 4 along a first movement path 100 by at least one translucent element, which is shown as a polarization maintaining fiber (hereafter "PM fiber") 8. The PM fiber 8 directs the beam 12 into the sensor head 4, after which the beam 12 is passed sequentially through elements 22, 24 and 26, then backwardly through elements 26 and 24 and into elements 46 and 47. The beam 12 is then routed from the sensor head elements 46 and 47 by a pair of single-mode or multi-mode optical fibers 42 and 45. The optical fibers 8, 42 and 45 electrically isolate the sensor head 4. Although PM fiber 8 is used in the preferred embodiment to deliver light to the transducer 26, other means can be used as well, including low-birefringence fiber, single-mode fiber, and multi-mode fiber, as well as a steered collimated beam.

In the preferred embodiment, the sensor head 4 has a cross sectional area of only approximately fifty millimeters squared (50 mm$^2$) or less, and a length of approximately twenty five centimeters (25 cm) or less. The sensor head 4, when placed in an E-field (not shown) causes a differential phase modulation of the components in the orthogonal planes of a light beam 12.

FIG. 1 shows the preferred embodiment of the sensor head 4. The sensor head 4 comprises a polarizing means which is shown as a polarizer 22, a translucent means shown as a translucent medium 24, a transducing means shown as a transducer 26, a reflecting means shown as a retro-reflector 27, a polarizing beam splitting means shown as a polarizing beam splitter 46, and beam reflector 47. The polarizer 22 re-polarizes the beam 12 emerging from the PM fiber 8 through the collimator 14. Since light from PM fiber is already polarized, the polarizer 22 is an optional device that can be used to ensure proper and stable polarization alignment with the electro-optic axes of transducer 26. The polarizer 22 linear-polarizes the beam 12 such that the beam comprises at least two beam components which are propagating in orthogonal planes. In practice, the polarizer 22 may be eliminated or placed anywhere between the transducer 26 and the source (not shown) of the beam 12, including anywhere along the PM fiber 8.

The beam 12 passes from the polarizer 22 through the translucent medium 24 and into the transducer 26. The translucent medium 24 is a translucent means which comprises a non-conductive, non-birefringent material, such as fused quartz, fused silica, or a similar substance. The sensor head is designed to be installed in several varieties of high voltage transmission and distribution apparatus in which an E-field is naturally produced. This apparatus is typically co-axial, producing an intense, tightly-controlled radial electric flux between inner and outer conductors. Additionally, the electric flux in such apparatus is proportional to the voltage thereof. In accordance with fundamental principles of electromagnetics, an E-field accompanies this electric flux as well. By mounting the transducer within this electric flux, an E-field proportional to voltage is established within the transducer, which in turn undergoes the electro-optic effect. As the behavior and durability of the polarizer 22 and optic fibers 8, 42, 45 in the presence of intense E-fields are in some cases either undesirable or not well known, a translucent medium 24 can be used to provide a pathway for the beam 12 from the polarizer 22, which can in such cases be located outside of the intense E-field, to the transducer 26, which is positioned directly in the intense E-field where the Electro-optic effect takes place. Due to the tightly controlled nature of this E-field, voltage measurement based upon E-field magnitude as described herein is highly accurate and impervious to external influences.

The transducer 26, when in an E-field (not shown), induces a differential phase shift between the orthogonal planes of the beam 12 through the Pockels electro-optic effect. The differential phase shift varies in magnitude responsive to the presence of an E-field, meaning that the differential phase shift which is induced in the absence of an E-field differs in magnitude from the differential phase shift which is induced in the presence of an E-field.

The Pockels linear electro-optic effect, commonly called the electro-optic effect for short, is observed in Pockels transducing crystals and similar media. The Pockels electro-optic effect is observed as a shift between the relative phases of the beam components. This shift is induced in the beam 12 by the transducer 26, also called the transducing medium. The magnitude of the effect corresponds, usually proportionally to the magnitude of the E-field.

In the preferred embodiment the transducer 26, or transducing medium, comprises a material which exhibits the Pockels electro-optic effect. In the present invention the transducer 26 is preferably Magnesium Oxide-doped Lithium Niobate (MgO-LiNbO$_3$), although other materials, such as Ammonium Dihydrogen Phosphate (NH$_4$H$_2$PO$_4$), Ammonium Dideuterium Phosphate (NH$_4$D$_2$PO$_4$), Potassium Dideuterium Phosphate (KD$_2$PO$_4$), Lithium Niobate (LiNbO$_3$), Lithium Tantalate (LiTaO$_3$), electro-optic polymers, organic materials, and others can be used. The detector (not shown) employs two photo detectors and a two-channel signal processor to determine voltage.

The differential phase shift between orthogonal components of the beam 12 produces a corresponding alteration of the polarization of the beam 12, thus allowing determination of the original E-field intensity from the Pockels effect by analyzing magnitude of the polarization change. The magnitude of the shift is proportional to the magnitude of the E-field, and thus the magnitude of the voltage. Hence, the polarization state of the beam 12 is directly representative of E-field magnitude and voltage.

The beam 12 passes from the transducer 26 and enters into the retro-reflector 27.

The retro-reflector 27 comprises a reflector material 29. The reflector material in the preferred embodiment has two functions; one is to reflect the beam 12 and the other is to cause a quarter-wave shift between the components in orthogonal planes of the beam 12. In the preferred embodiment, the reflector material 29 has an index of refraction and incident angle that together facilitate total-internal reflection of beam 12. An alternative embodiment would include a reflective coating (shown in FIGS. 4 and 5 at 28) disposed on the surfaces of the reflector material 29 for causing the beam 12 to reflect at the boundaries of the reflector material 29.

The quarter-wave retardation property of the retro-reflector 27 induces a differential ¼ wavelength shift between the orthogonal planes of the beam 12 through either using a reflector material 29 possessing intrinsic birefringence, or by inducing a phase shift upon reflection of the beam 12. The ¼ wavelength shift may be either a single order or a multiple order shift. Therefore, the phrase "at least single order shift" is understood by those skilled in the art to include both single and multiple order wavelength shifts. The reflector material 29 thus in the preferred embodiment includes phase shifting means for shifting the phase of at least one of the beam components to thereby achieve a differential phase shift between said beam components of ¼ of a wave length. This could be accomplished by shifting the phase of only one of the beam components by ¼ of a wave length, or by shifting the phase of both components such that the collective result is a differential phase shift of ¼ of a wave length.

In the embodiment employing a reflector material 29 containing intrinsic birefringence, the birefringence is not dependant upon the E-field. In the preferred embodiment, the reflector material 29 induces a ⅛ wavelength differential phase shift upon the beam at each reflection, producing a collective ¼ wavelength ($\pi/2$ radians) shift following the two reflections within the retro-reflector 27.

Those skilled in the art will appreciate that reflective coating (shown in FIGS. 4 and 5 at 28) may further serve to induce, or partially induce, the ¼ wave length shift of the beam 12, as phase shifts are known to occur in electromagnetic radiation upon reflection from a suitable surface. One skilled in the art could further induce a ¼ wave length shift in beam 12 by combining reflection and intrinsic birefringence.

The polarization of the beam 12 entering the retro-reflector 27 depends upon the E-field magnitude present when the beam 12 makes a first pass through the transducer 26. If there is an E-field present then there will be some differential phase shift already present in the beam 12. The $\pi/2$ retardation within the retro-reflector 27 biases the sensor's overall resultant polarization such that zero E-field (and hence zero voltage) corresponds to circular-polarized light, as no differential phase shift is present in the beam 12 from either pass through the transducer 26. However, due to the location of the retro-reflector in the sensor head, if the transducer 26 is in a non-zero E-field and induces a differential phase shift in the beam 12, then the retro-reflector 27 will not convert light from linear to circular-polarization. Rather, it will induce elliptical-polarization upon the beam 12. The ellipticity of this polarization will modulate between −1 and 30 1 in proportion to the voltage. While a laser is used in the preferred embodiment, other sources of electromagnetic radiation could also be used in the practice of the invention.

The reflection of the beam 12 in the retro-reflector 27 is in accordance with the principle of the angle of incidence being the same as the angle of reflection. In the practice of the preferred embodiment of the present invention, the retro-reflector 27 is configured to cause a 180° change in the direction of the beam 12, thereby sending the beam backwardly into the transducer 26 along a second movement path 101. The second movement path 101 is preferably, but not necessarily, parallel to the first movement path 100.

When the beam 12 reenters the transducer 26 from the retro-reflector 27, it undergoes further differential phase shift from the Pockels electro-optic effect. The beam 12 then passes through the transparent medium 24 and enters into the polarizing beam splitter 46.

Figure 3:
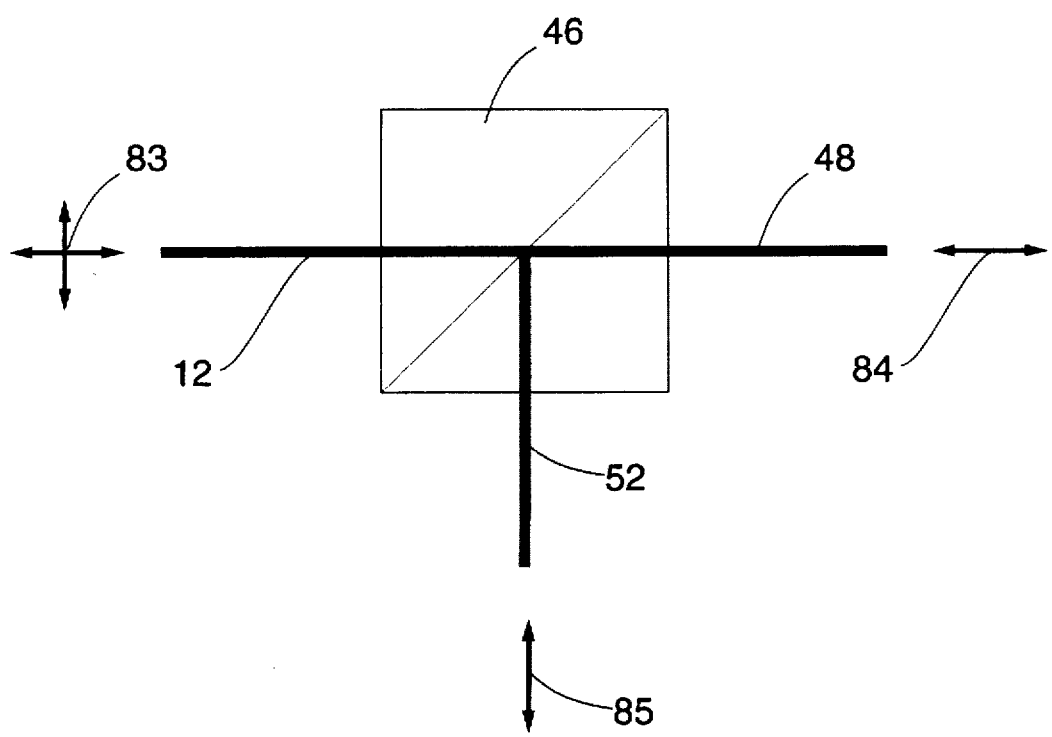
FIG. 3 is a diagram of the light polarizing beam splitter of FIG. 1.

In the polarizing beam splitter 46, (also called an analyzer in the art), the beam 12 is separated in accordance with the respective axes of its polarization ellipse into AM signals 48 and 52. The said polarization ellipse will exhibit an ellipticity ranging between −1 and +1, in proportion to voltage at any given time. As shown in FIG. 3, the major and minor axes of the polarization ellipse of beam 12 can be represented by two orthogonal components, indicated generally at 83. The polarizing beam splitter 46 then separates the beam 12 into two components 84 and 85 corresponding to the optic intensities of the beam 12 along the axes of the polarization ellipse. The intensity of beam components 84 and 85 will modulate conversely to one another in response to modulations (in other words, these are independent converse amplitude-modulated signals) in the ellipticity of the beam's polarization state. The beam components 84 and 85 are two AM signals shown as 48 and 52, respectively, which contain the information needed to determine voltage.

The AM signals 48 and 52 then pass through the collimators 16 and 18, shown in FIG. 1, (also shown in FIGS. 4, 5, and 6) and are routed through at single-mode or multi-mode optic fibers 42 and 45. A beam reflector 47 may be used to aid in routing one of the AM signal 48 or 52.

Figure 4:
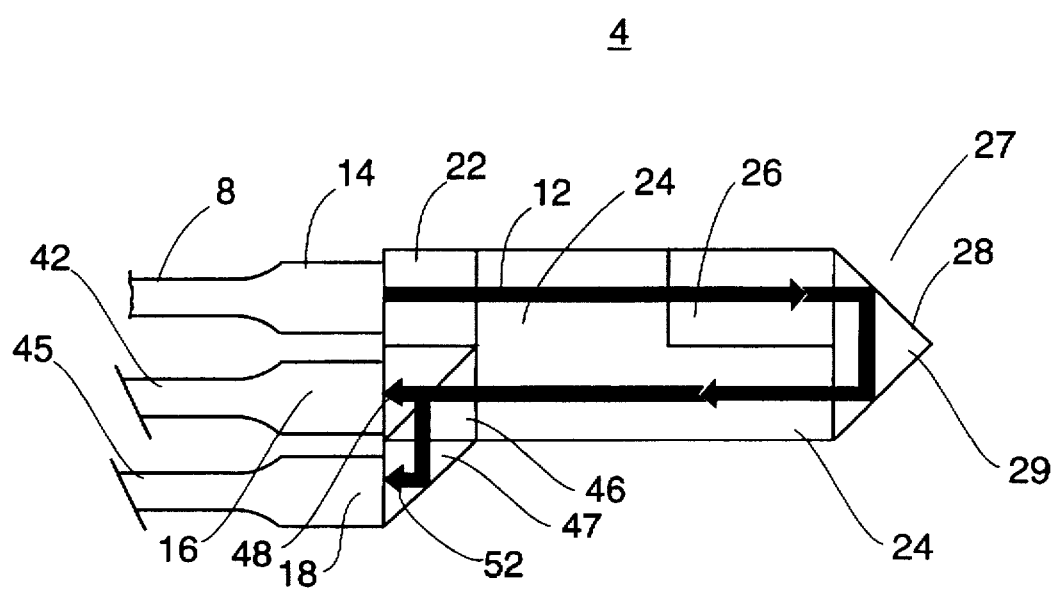
FIG. 4 is a schematic top-down view of an alternative embodiment of the sensor head made in accordance with the principles of the present invention.
Figure 5:
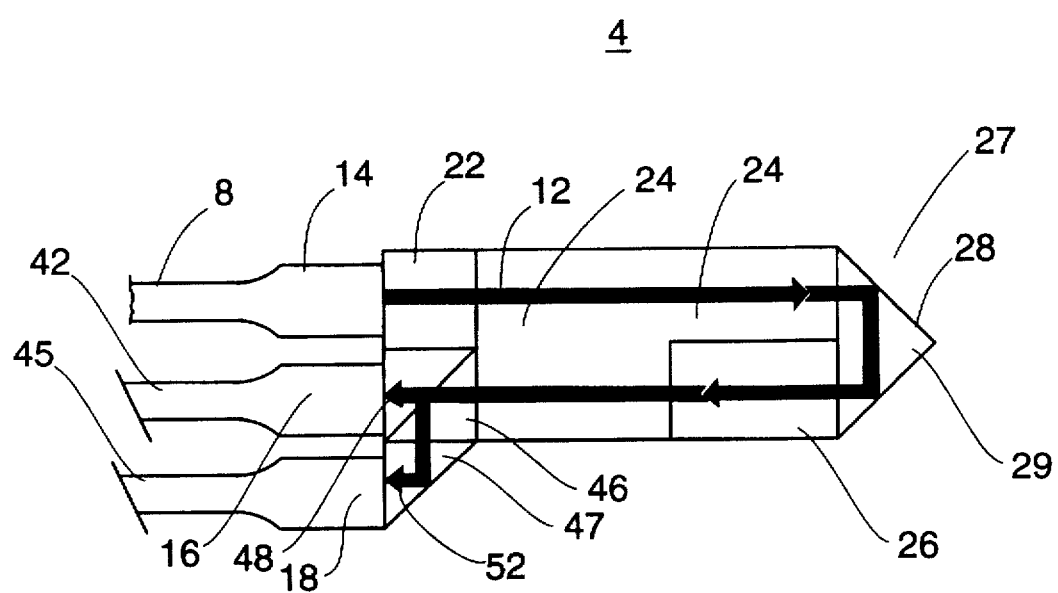
FIG. 5 is a schematic top-down view of an alternative embodiment of the sensor head made in accordance with the principles of the present invention.
Figure 6:
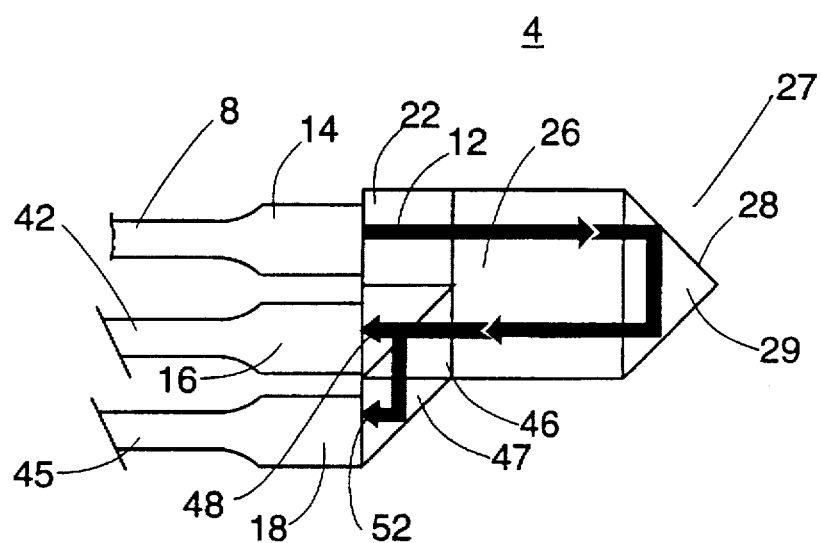
FIG. 6 is a schematic top-down view of an alternative embodiment of the sensor head made in accordance with the principles of the present invention.

FIGS. 4 and 5 show alternative embodiments of the present invention. In these alternative embodiments the beam 12 is reflected by a retro-reflector 27; however, the beam only passes through the transducer 26 once. As can be seen, in FIG. 4 the beam 12 may pass through the transducer 26 before being reflected by the retro-reflector 27, or as in FIG. 5 the beam 12 may pass through the transducer 26 after being reflected by the retro-reflector 27. FIG. 6 depicts an alternative embodiment in which no translucent medium 24 is used. In these three alternatives, the reflection of the beam 12 at a desired angle, shown as 180° enables the fibers 8, 42 and 45 to be aligned as desired, which in the preferred embodiment is parallel to one another.

In accordance with FIG. 4, the retro-reflector 27 is essentially a reflecting means for receiving the beam 12 from the transducer 26 and reflecting the beam into the polarizing beam splitter 46. This element shall refer broadly to redirection of the beam 12 from the transducer 26 into the beam splitter 46, regardless of whether any intermediate elements reside along the beam movement path between the transducer and the beam splitter, such as the translucent medium 24. Similarly and in reference to FIG. 5, the retro-reflector 27 may comprise a reflecting means for receiving the beam 12 from the polarizer 22 and reflecting the beam into the transducer 26. This element shall refer broadly to redirecting the beam 12 from the polarizer 22 into the transducer 26, regardless of whether any intermediate elements resides in the movement path of the beam between the polarizer 22 and the retro-reflector 27, such as the translucent material 24 as shown in FIG. 5.

It is noted that many of the advantages of the present invention accrue do to the simplified structure of the sensor head, which is sufficiently small so as to be conveniently placed or installed in devices in which electric-fields arise, or built in as part of the device.

Although the prior art apparatus and methods for high voltage measurement have attempted to use the electro-optic effect in materials having either a Pockels or Kerr coefficient, they have typically required a separate compensator crystal with a known reference voltage or a separate voltage divider directly connected to the energized conductor in order to make a voltage determination. The result has been devices which were bulky and required additional electronics for measuring the known reference, or required extra hardware which presents size, weight, reliability, and other problems.

By integrating the sensor head into the described high voltage transmission and distribution apparatus, voltage measurement is achieved without the use of a large, dedicated, stand-alone device. Because real estate within power substations is at a premium, this sensor offers a substantial economic advantage due to space savings. In addition, contact with the energized conductor is substantially reduced and in most cases altogether eliminated with the practice of the present invention. This is advantageous, as an energized conductor can present significant life and health risks among other hazards and problems associated with the use of the voltage dividers in the prior art.

Those skilled in the art will appreciate from the preceding disclosure that the objectives stated above are advantageously achieved by the present invention.

It is to be understood that the above-described arrangements are only illustrative of the application of the principles of the invention. Numerous modifications and alternative arrangements may be devised by those skilled in the art without departing from the spirit and scope of the present invention and the appended claims are intended to cover such modifications and arrangements.

I claim:

1. A sensor head for use in combination with at least one beam of electromagnetic radiation for detecting presence and magnitude of E-field and voltage, said sensor head comprising:

polarizing means for polarizing said at least one beam such that said at least one beam comprises at least two beam components in at least two orthogonal planes;

transducing means for receiving said at least one beam from said polarizing means and inducing a differential phase shift of the beam components which varies in magnitude in response to the magnitude of an E-field; and first reflecting means for receiving said at least one beam from said transducing means and reflecting said beam back into said transducing means.

2. The sensor head as in claim 1, wherein the sensor head further comprises:

quarter wave retarding means for biasing the beam's polarization such that zero E-field magnitude on the transducer corresponds to a circular polarization state.

3. The sensor head as in claim 1, wherein said reflecting means comprises a material having at least one surface, the incident angle of said beam with respect to the at least one surface of said reflecting means exceeding the critical angle as known in the art, and wherein said reflecting means also comprises a material having sufficient index of refraction to cause reflection at each of said reflection surfaces of said reflecting means.

4. The sensor head as in claim 1, wherein said reflecting means comprises a material having at least one surface, a reflective coating disposed on at least one surface of said reflecting means wherein said reflective coating accomplishes reflection of said beam.

5. The sensor head as in claim 2, wherein said quarter wave retarding means resides within said reflecting means, said reflecting means further comprising:

phase shifting means for shifting the phase of at least one of said beam components to thereby achieve a differential phase shift between said beam components of one-quarter of a wavelength, said quarter wavelength shift comprising at least a single order shift.

6. The sensor head as in claim 2, wherein said quarter wave retarding means comprises:

a quarter wave plate disposed at a point within the path of said beam following said polarizing means for shifting the phase of at least one of said beam components one-quarter of a wavelength, said quarter wavelength shift comprising at least a single order shift.

7. The sensor head as in claim 1, wherein said transducing means further comprises a Pockels transducing material.

8. The sensor head as in claim 7, wherein said Pockels transducing material is a material selected from the group consisting of:

Lithium Niobate ($LiNbO_3$),

Ammonium Dihydrogen Phosphate ($NH_4H_2PO_4$),

Ammonium Dideuterium Phosphate ($NH_4D_2PO_4$),

Potassium Dideuterium Phosphate ($KD_2PO_4$),

MgO-doped Lithium Niobate ($MgO-LiNbO_3$),

Lithium Tantalate ($LiTaO_3$),

Electro-optic polymers, and

Organic material.

9. The sensor head as in claim 1, wherein said sensor head further comprises:

translucent means disposed between the polarizing means and the transducing means for receiving said at least one beam from said polarizing means and transmitting said beam to said transducing means.

10. The sensor head as in claim 9, wherein said translucent medium further comprises a material that is substantially non-birefringent and nonconductive.

11. The sensor head as in claim 1, wherein said sensor head further comprises:

beam separation means for separating the beam components corresponding to the major and minor axes of the polarization ellipse of said at least one beam, forming at least two signals therefrom.

12. The sensor head as in claim 11, wherein said beam separation means is disposed adjacent to said transducing means.

13. The sensor head as in claim 11, wherein said sensor head further comprises:

translucent means disposed between the transducing means and the separation means for receiving said at least one beam from said transducing means and transmitting said beam to said separation means.

14. The sensor head as in claim 13, wherein said translucent means further comprises a material that is substantially non-birefringent and nonconductive.

15. The sensor head as in claim 11, wherein said at least two signals comprise independent converse amplitude-modulated signals.

16. The sensor head as in claims 10 or 14, wherein said translucent means comprises at least one material selected from the group consisting of: fused quartz, fused silica, and nonconductive translucent media.

17. The sensor head as in claims 10 or 14, wherein said translucent means comprises at least one fiber selected from the group consisting of: collimator-coupled low-birefringence fiber and polarization-maintaining optic fiber.

18. A sensor head for use in combination with at least one beam of electromagnetic radiation for detecting an E-field, said sensor head comprising:

polarizing means for polarizing said at least one beam such that said at least one beam comprises at least two beam components in at least two orthogonal planes;

transducing means for receiving said at least one beam from said polarizing means and inducing a differential phase shift of the beam components which varies in magnitude in response to the magnitude of an E-field; and second reflecting means for receiving said at least one beam from said polarizing means and reflecting said beam into said transducing means.

19. The sensor head as in claim 18, wherein the sensor head further comprises:

quarter wave retarding means for biasing the beam's polarization such that zero E-field magnitude on the transducer corresponds to a circular polarization state.

20. A sensor head for use in combination with at least one beam of electromagnetic radiation for detecting an E-field, said sensor head comprising:

polarizing means for polarizing said at least one beam such that said at least one beam comprises at least two beam components in at least two orthogonal planes;

transducing means for receiving said at least one beam from said polarizing means and inducing a differential phase shift of the beam components which varies in magnitude in response to the magnitude of an E-field;

beam separation means for receiving said at least one beam and separating the beam components and forming at least two signals therefrom; and third reflecting means receiving said at least one beam from said transducing means and reflecting said beam into said beam separation means.

21. The sensor head as in claim 20, wherein the sensor head further comprises:

quarter wave retarding means for biasing the beam's polarization such that zero E-field magnitude on the transducer corresponds to a circular polarization state.

22. A method for detecting an E-field using at least one beam of polarized electromagnetic radiation having at least two beam components propagating in at least two orthogonal planes, comprising the steps of:

(a) imposing an E-field upon at least one transducing means by disposing said transducing means into an apparatus containing electric flux proportional to voltage;

(b) passing said beam through said at least one transducing means;

(c) inducing a differential phase shift between the beam components when said beam passes through said transducing means in said E-field, said differential phase shift indicating the presence and magnitude of said E-field;

(d) reflecting said beam after said beam has passed through the transducing means with a reflective means, so that said beam is directed back into the transducing means, thereby causing said beam to reenter the transducing means;

(e) separating beam components into at least one pair of converse amplitude modulated (AM) signals, said AM signals corresponding to the major and minor axes of said beam's polarization ellipse, whose ellipticity modulates between −1 and +1 in proportion to voltage, wherein intensity along each of said axes modulates conversely to the intensity exhibited along the other axis;

(f) transmitting said AM signals, whereby the E-field magnitude (and hence voltage) can be ascertained.

* * * * *